(12) United States Patent
Lee et al.

(10) Patent No.: US 9,454,630 B1
(45) Date of Patent: Sep. 27, 2016

(54) GRAPHICAL REPRESENTATION OF INTEGRATED CIRCUITS

(71) Applicant: Xilinx, Inc., San Jose, CA (US)

(72) Inventors: Chong M. Lee, Broomfield, CO (US);
David L. Kreymer, Seattle, WA (US);
Ian L. McEwen, Golden, CO (US)

(73) Assignee: XILINX, INC., San Jose, CA (US)

( * ) Notice: Subject to any disclaimer, the term of this patent is extended or adjusted under 35 U.S.C. 154(b) by 833 days.

(21) Appl. No.: 13/777,798

(22) Filed: Feb. 26, 2013

(51) Int. Cl.
*G06F 17/50* (2006.01)

(52) U.S. Cl.
CPC .................. *G06F 17/5068* (2013.01)

(58) Field of Classification Search
None
See application file for complete search history.

(56) References Cited

U.S. PATENT DOCUMENTS

| | | | |
|---|---|---|---|
| 2002/0038451 A1 | 3/2002 | Tanner et al. | |
| 2003/0208721 A1* | 11/2003 | Regnier | G06F 17/5022 716/106 |
| 2004/0123306 A1 | 6/2004 | Gazda et al. | |
| 2005/0108627 A1* | 5/2005 | Mireku | G06F 17/2288 715/234 |
| 2006/0150200 A1 | 7/2006 | Cohen et al. | |
| 2006/0195508 A1 | 8/2006 | Bernardin et al. | |
| 2008/0098018 A1* | 4/2008 | King | G06F 17/30961 |
| 2009/0235282 A1 | 9/2009 | Meijer et al. | |
| 2010/0162275 A1 | 6/2010 | Bradley et al. | |
| 2013/0170525 A1* | 7/2013 | Asaad | G06F 17/5027 375/219 |

OTHER PUBLICATIONS

Mueller et al., FPGA-Accelerated Deserialization of Object Structures, Sep. 2009, Microsoft Corporation, pp. 1-18.*

U.S. Appl. No. 13/777,660, filed Feb. 26, 2013, Lee.
Google Inc., *Developer Guide, Overview*, last updated Apr. 2, 2012, downloaded Dec. 12, 2012, pp. 1-3, available from Google Inc. at <https://developers.google.com/protocol-buffers/docs/overview>.
Swig, *Executive Summary*, last modified Mar. 10, 2009, downloaded Dec. 12, 2012, pp. 1-2, available at <http://www.swig.org/exec.html>.
Wikipedia, *Base64*, last modified Nov. 27, 2012, downloaded Dec. 13, 2012, pp. 1-10, available from Wikipedia at <http://en.wikipedia.org/wiki/Base64>.
Wikipedia, *Protocol Buffers*, last modified Nov. 16, 2012, downloaded Dec. 13, 2012, pp. 1-3, available from Wikipedia at <http://en.wikipedia.org/wiki/Protocol_Buffers>.
Grüner, Sten et al., "Teaching Erlang Using Robotics and Players/Stage," *Proc. of the 8th ACM SIGPLAN Workshop on ERLANG*, Aug. 31, 2009, pp. 33-40, ACM, New York, New York, USA.
Kiselyov, Oleg, "Delimited Control in OCaml, Abstractly and Concretely," submitted to *Theoretical Computer Science* on Feb. 29, 2012, pp. 1-46, Springer-Verlag Berlin, Heidelberg, Germany.

* cited by examiner

*Primary Examiner* — Omar Fernandez Rivas
*Assistant Examiner* — Bernard E Cothran
(74) *Attorney, Agent, or Firm* — LeRoy D. Maunu

(57) ABSTRACT

A system for graphics generation includes a processor configured to implement a modeling process and a GUI process. The modeling process is configured to generate a first graphics model including a plurality of objects. Each object defines a respective graphical depiction for a respective element of a programmable IC. The modeling process is also configured to serialize objects of the first graphics model according to a first application programming interface (API) definition file to produce a serialized graphics model. The GUI process is configured to, in response to receiving one or more objects of the serialized graphics model, deserialize the one or more objects of the serialized graphics model according to the first API definition file to produce a second graphics model. The GUI process is further configured to render the one or more objects of the second graphics model.

20 Claims, 6 Drawing Sheets

GRAPHICAL REPRESENTATION OF INTEGRATED CIRCUITS

COPYRIGHT NOTICE

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

TECHNICAL FIELD

The disclosure generally relates to the computer-aided design of integrated circuits (ICs).

BACKGROUND

Programmable ICs may be programmed by a user to perform specified logic functions. One type of programmable IC, known as a field programmable gate array (FPGA), typically includes programmable resources that are arranged in an array of programmable tiles including, for example, input/output blocks (IOBs), configurable logic blocks (CLBs), dedicated random access memory blocks (BRAM), multipliers, digital signal processing (DSPs) blocks, processors, clock managers, delay lock loops (DLLs), bus or network interfaces such as Peripheral Component Interconnect Express (PCIe) and Ethernet and so forth. Programmable ICs provide flexible hardware solutions that are advantageous for high performance parallel computing in advanced digital communications and video applications.

Programming data used to configure a programmable IC is often very complex. The complexity may be managed by designing circuits at higher levels of abstractions. For instance, using a hardware description language (HDL), circuits can be designed at the gate level, the register transfer level (RTL), and higher logical levels. Circuits may be combined and augmented to form higher-level modules. System-level integration may rely on reuse of a library of previously created logic blocks including, for example, adders, multipliers, filters, and other arithmetic and DSP functions from which system designs can be readily constructed.

Computer aided design (CAD) tools provide a mechanism for users to quickly visualize, connect, and modify objects of a system level design using a graphical user interface (GUI). Using CAD tools, circuit designs can be assembled using a graphical user interface, translated into a hardware description language (e.g., HDL and VHDL), and synthesized into hardware configuration data. Some CAD tools used for circuit design also provide a mechanism for simulation and debugging of circuit designs.

Some CAD tools include one or more backend processes that maintain a data representation of the objects and connections of a programmable IC and a separate GUI process that renders objects and connections of the programmable IC for display to a user. Communication of data between the backend processes and the GUI process of a CAD tool can pose a significant challenge. For instance, in some CAD systems, graphics modeling data for each object to be displayed to a user is individually communicated to from backend processes to a GUI. Such implementations require large amount of graphics modeling data to be communicated to the GUI for display. Furthermore, in some implementations backend processes and the GUI may be written in different source languages (e.g., C++ and Java), making efficient communication of graphics data more difficult.

SUMMARY

A system for graphics generation is provided. The system includes a processor configured to implement a modeling process and a GUI process. The modeling process is configured to generate a first graphics model including a plurality of objects. Each object defines a respective graphical depiction for a respective element of a programmable IC. The modeling process is also configured to serialize objects of the first graphics model according to a first application programming interface (API) definition file to produce a serialized graphics model. The GUI process is configured to, in response to receiving one or more objects of the serialized graphics model, deserialize the one or more objects of the serialized graphics model according to the first API definition file to produce a second graphics model. The GUI process is further configured to render the one or more objects of the second graphics model.

A method for graphics generation is also provided. Using a first process on a programmed processor, a first graphics model is generated that includes a plurality of objects. Each object defines a respective graphical depiction for a respective element of a programmable IC. Objects of the first graphics model are serialized according to a first API definition file to produce a serialized graphics model. The serialized graphics model is provided to a second process. Using the second process on the programmed processor, the one or more objects of the serialized graphics model are deserialized according to the first API definition file to produce a second graphics model. The one or more objects of the second graphics model are rendered using the second process on the programmed processor.

Another method for graphics generation is also provided. Using a first process on a programmed processor, a first graphics model is generated that includes a plurality of objects. Each object defines a graphical depiction for a respective element of a programmable IC. Objects of the first graphics model are serialized according to a plurality of protocol buffers defined in an API definition file to produce a serialized graphics model. The serialized graphics model is provided to a second process. Using the second process on the programmed processor, the one or more objects of the serialized graphics model are deserialized according to the plurality of protocol buffers to produce a second graphics model. In response to a first input command, the second graphics model is used to render a first subset of the elements corresponding to logic components of the programmable IC without rendering a second subset of the elements corresponding to routing resources of the programmable IC. In response to a second input command, the second graphics model is used to render the first and second subsets of the elements.

Other embodiments will be recognized from consideration of the Detailed Description and Claims, which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

Methods and circuits are disclosed for the communication of graphics data between a graphics modeling process and a GUI process of a CAD tool. The graphics modeling process is configured to generate a graphics data model that describes a graphical representation of each object in a programmable IC. The graphics model is serialized according to an application program interface (API) definition file and communicated to the GUI. The GUI is configured to deserialize objects of the received graphics model according to the API definition file and render the deserialized objects for display. This methodology simplifies runtime communication between the graphics modeling process and the GUI process of the CAD tool. Further, communication of the graphics model in serialized form reduces the amount of data that is communicated and improves runtime performance.

In some embodiments, serialization and deserialization of the graphics model is performed according to a protocol buffer API definition file (e.g., a .proto file). Protocol buffers are a language-neutral, platform-neutral, extensible mechanism that may be used to serialize structured data in communications protocols. One or more protocol messages that specify how information is to be structured can be defined. Each protocol message can include a set of name-value pairs, and each name-value pair includes a name and a value type. A value type may be a number (e.g., an integer or a floating-point), a Boolean, a string, raw bytes, and the like. In addition, value types can also include other protocol messages. Accordingly, protocol buffers enable information to be structured hierarchically.

Once protocol messages are defined, the definitions can be run through a protocol buffer compiler to automatically generate data access mechanisms as well as serialization/deserialization mechanisms. The serialization/deserialization mechanisms are configured to convert a protocol message object (e.g., an object instance of the protocol message populated with actual data) into a protocol buffer (e.g., raw bytes) for serialization, and to convert the protocol buffer into the protocol message object for deserialization. The data access mechanisms facilitate communication of data using the name-value pairs defined by the protocol messages.

The protocol buffer API also helps facilitate communication between processes derived from different programming languages (e.g., C, C++, Python, and Java). For instance, in some implementations, the graphics modeling process is compiled from C++ code and the GUI process is compiled from Java code. The protocol buffer API provides a language neutral bridge to communicate data using serialization and deserialization processes.

Figure 1:
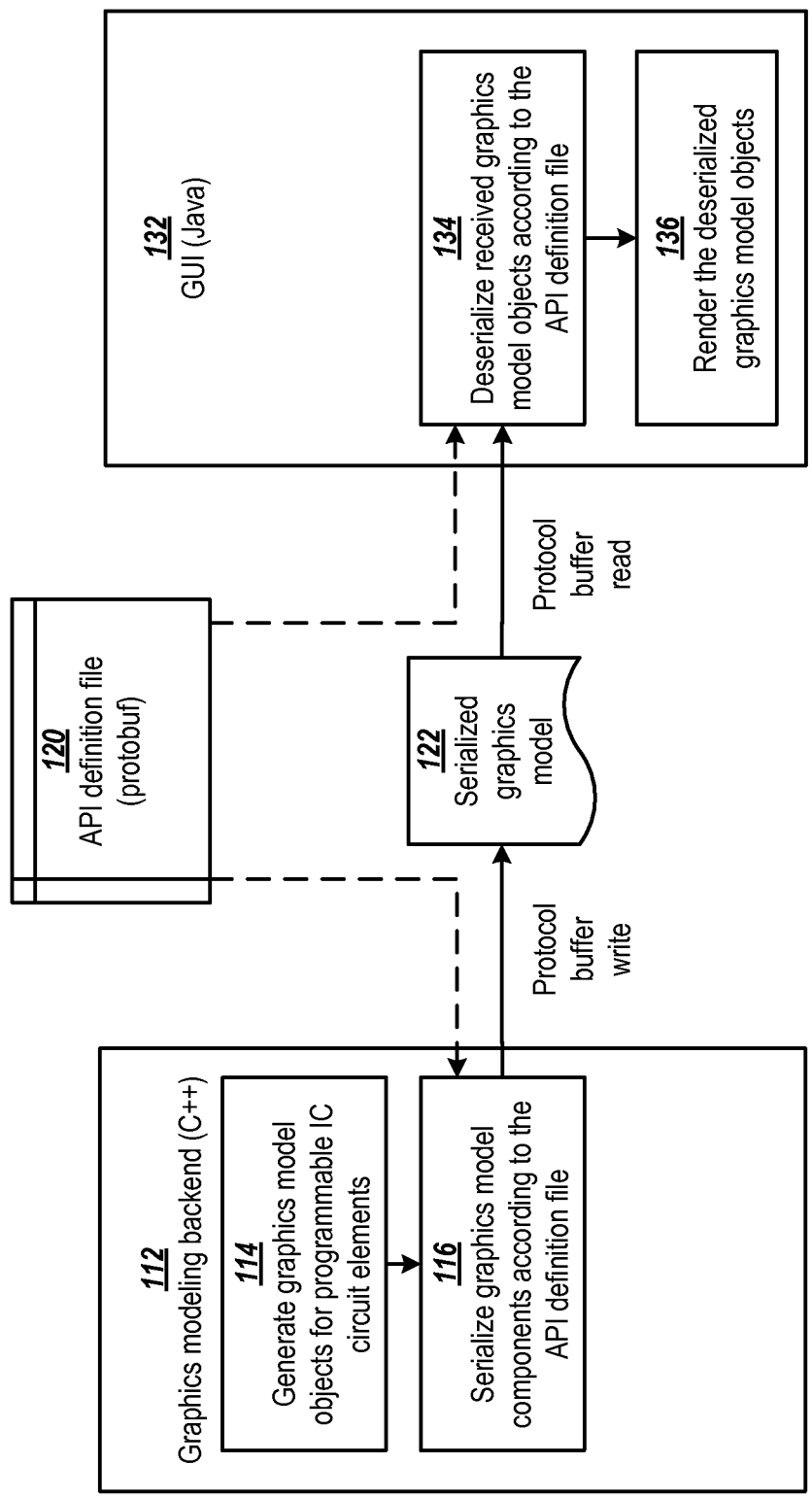
FIG. 1 shows a method for providing a graphical representation of the elements inside a programmable IC.

Turning now to the figures, FIG. 1 shows a method for providing a graphical representation of a programmable IC.

A graphics modeling process 112 is configured to generate graphics model objects for elements of the programmable IC at block 114. The graphics model indicates the elements of the programmable IC model to depict graphically, including, for example, tiles, logic elements, wires, switchboxes, I/O banks, clock regions, and programmable interconnect points (PIPs). The graphics model defines graphical representation features for these elements, such as, shape, dimensions, and location. The graphics model may also associate other information with the elements, such as layer identification, color, textual labels, and tagging.

The graphics modeling process 112 is configured to serialize the generated graphics model objects of the programmable IC according to an API definition file 120 at block 116 to generate a serialized graphics model 122. The serialized graphics model is communicated to a GUI process 132. The GUI process 132 is configured to deserialize the received serialized graphics model according to the API definition file 120 at block 134. The GUI process is further configured to render the deserialized graphics model objects (i.e., generate pixels for of the deserialized objects) at block 136.

Figure 2:
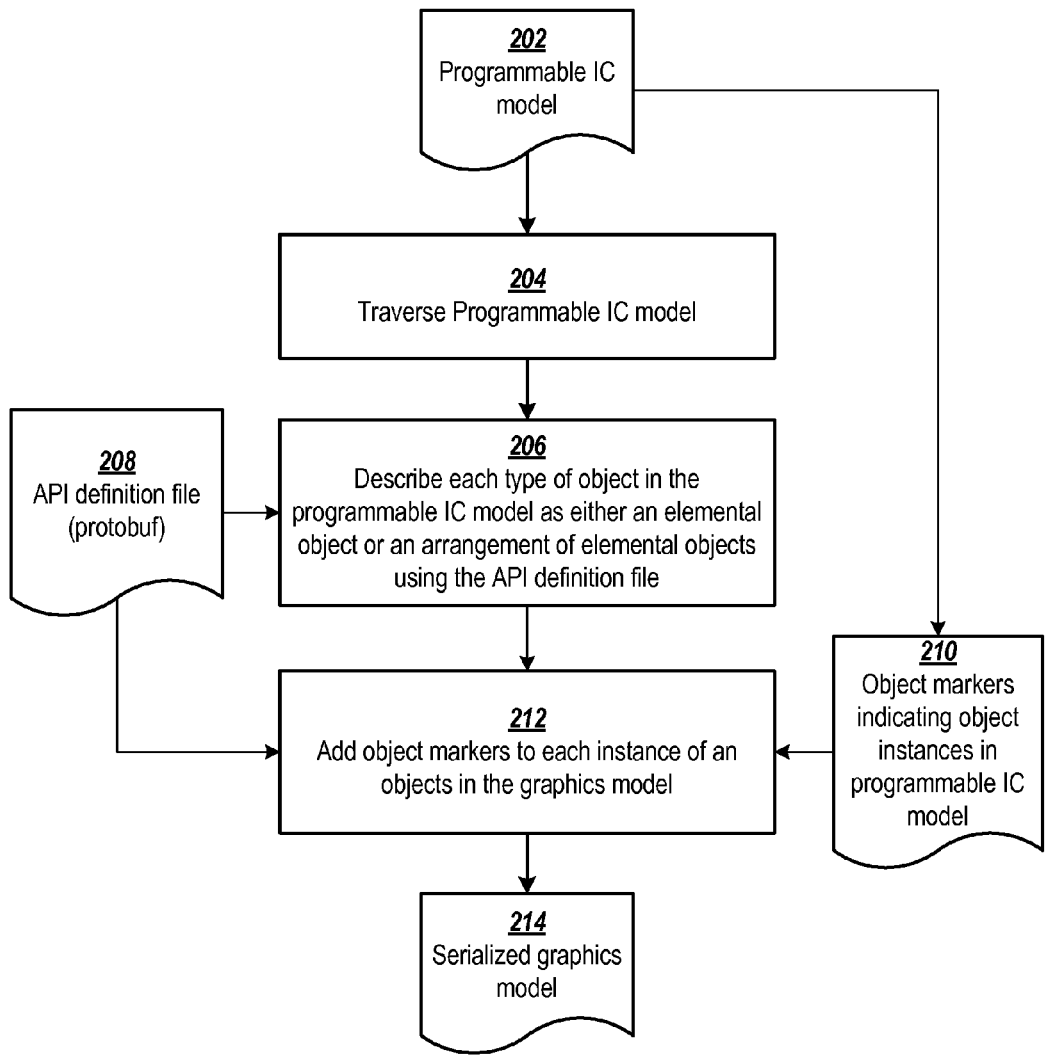
FIG. 2 shows a flowchart of a method for serializing a graphics model of a programmable IC.

FIG. 2 shows a flowchart of a method for producing a serialized graphics model of a programmable IC model. A programmable IC model 202 is traversed at block 204. At block 206, each type of object in the programmable IC model is described as either an elemental object or an arrangement of elemental objects using API definition file 208. Also each instance of an object in the programmable IC model 202 (as indicated by object markers 210), is replaced with a reference marker that references a corresponding object in the API definition file 208 to create a serialized graphics model 214.

As indicated above, the API definition file includes a number of elemental objects including, for example, lines, circles, arcs, triangles, polylines (continuous lines having multiple line segments), etc. Objects for more complex shapes may be defined as macro objects, which indicate arrangements of other objects of the API in combination. This hierarchical definition of graphics objects allows elemental objects to be communicated to and arranged by the GUI process to render more complex macro objects as well. For example, a graphical macro object might consist of a polygon representing a basic logical element such as a multiplexor along with multiple line segments extending perpendicular to the edges of the polygon representing the terminals or pins, where logic nets may attach.

As a first example, Example 1 shows an elemental object in a protocol buffer API definition file (.proto file) for a triangle. The elemental triangle object defines graphical features needed to display a triangle for a set of coordinates indicating corners of the triangle.

```
// Define a triangle primitive—Copyright XILINX 2013
message XgdTriangle
{
//coord[0]=the x coordinate of 1st corner of the triangle.
//coord[1]=the y coordinate of 1st corner of the triangle.
//coord[2]=the x coordinate of 2nd corner of the triangle.
//coord[3]=the y coordinate of 2nd corner of the triangle.
//coord[4]=the x coordinate of 3rd corner of the triangle.
//coord[5]=the y coordinate of 3rd corner of the triangle.
//coord[6]=tag id
repeated sint32 coord=I [packed=true];
optional TYPE type=2;
optional uint32 fill-color=3;
optional XGDALPHA alpha=4;
}
```

Example 1

As another example, Example 2 shows an elemental object in the protocol buffer API definition file for a text label. The elemental text object defines graphical features needed to display an indicated text at a set of coordinates.

```
// Define text primitive—Copyright XILINX 2013
message XgdText
{
required bytes text=1
repeated sint32 coord=2 [packed=true]; // store rectangle
    bounds instead
optional bool vertical=3 [default=false];
optional XGDALIGNMENT horizontal_alignment=4
    [default=LEFT];
optional XGDALIGNMENT vertical_alignment=5
    [default=BOTTOM];
optional TYPE type=6;
optional uint32 font_size=8;
}
```

Example 2

Example 3 shows a generic macro object included in the protocol buffer API definition file. The macro object indicates coordinates and various values of the macro object. The macro object also includes reference ID and various values for one or more child objects that are arranged to form the macro object.

```
// Define a macro call primitive—Copyright XILINX
    2013
message XgdMacroCall
{
//value[0]=a macro identifier value
//value[1]=the x coordinate of the macro call location
//value[2]=the y coordinate of the macro call location
//value[3]=tag id
//value[4]=optional testDisplayFlag
repeated sint32 value=1 [packed=true];
//Child ids that are associated with the macrocalls inside
//the macro that is instantiated by this macrocall. The
//association is done using the tag id of the macrocalls
in the macro.
repeated sint32 child-id=2 [packed=true];
repeated sint32 overlap_tag=4; // points to another over-
    lapping macro
}
```

Example 3

In some embodiments, the serialized graphics model may include graphics data for multiple representations and/or devices. For instance, the serialized graphics model may describe graphics for a single programmable IC, for a family of devices, or include data that is shared across multiple devices. In one implementation, a respective graphics file may be created for display of a resource layout of each device, and another graphics file is created with graphics data shared (e.g., overlaid) for all devices of a programmable IC family. For ease of explanation, examples are primarily described herein with reference to a single graphics model for a device.

In some embodiments, a generated graphics model is configured to describe multiple representations of the circuit design for a programmable IC layout. For example, in one implementation the graphics model describes a first set of objects for display in a simpler "floorplan" view of the circuit and a second set of objects for display in a more complex "detailed" view of the circuit. In the floorplan view, logic elements are displayed but not interconnect resources. In the detailed view, all the elements including routing interconnect wires, PIPs, and switchboxes are displayed. Other combinations of the elements of the circuit design and/or programmable IC may be selected to provide additional views.

Figure 3:
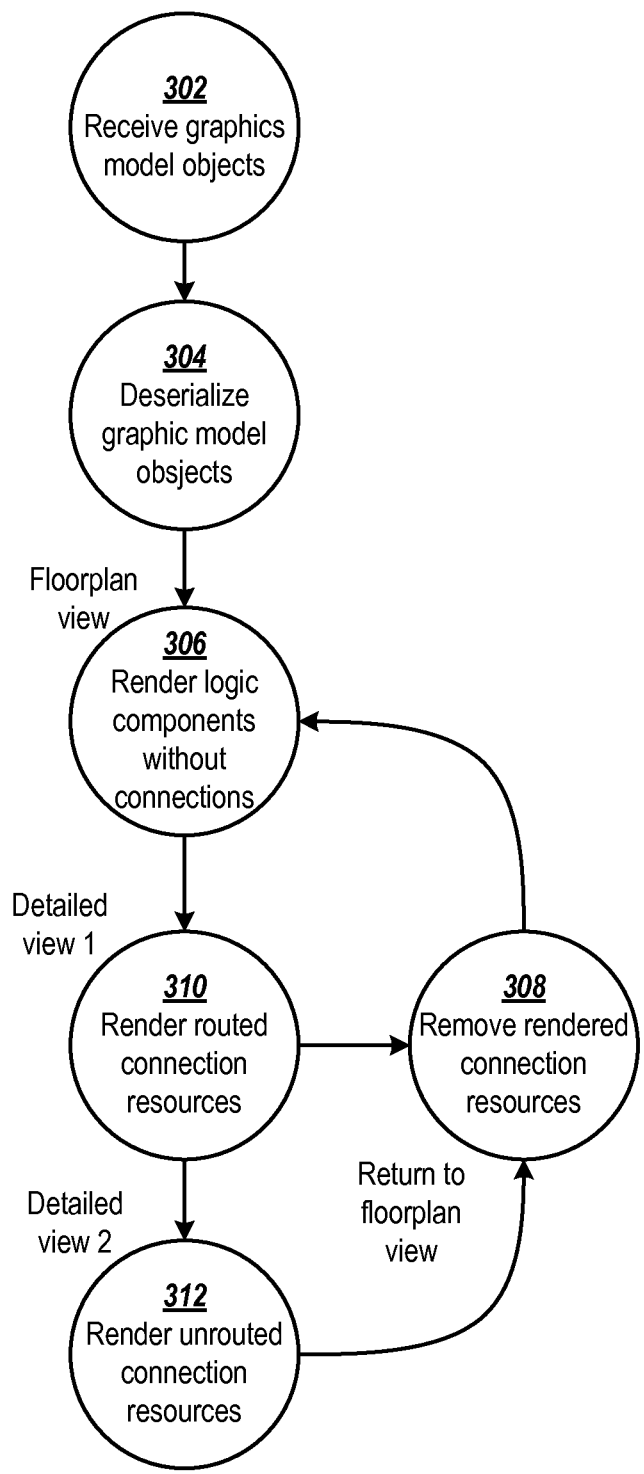
FIG. 3 shows a flowchart of a method for rendering objects of a serialized graphics model configured for multiple representations.

FIG. 3 shows a flowchart of a method for rendering objects of a serialized graphics model configured for multiple representations. Serialized graphics model objects are received at block 302. The serialized graphics model objects are deserialized at block 304. In this example, the GUI is configured to provide different views of the circuit design corresponding to different subsets of serialized graphics objects. In a first mode 306, the GUI renders only logic components of the deserialized objects to display a floorplan view. In this view, interconnect resources are not displayed. In a second mode 308, the GUI further renders routed connection resources of the deserialized objects to display a first detailed view. In a third mode 312, the GUI further renders unrouted connections of the deserialized objects to display a second detailed view. To return to the floorplan view from either of the detailed views (310 or 312), routing resources may be removed from the rendered image at block 308.

In addition to communication of the graphics models, in some embodiments, the graphics modeling and GUI processes of a CAD tool are further configured to communicate other data according to one or more additional API definition files. For instance, in some implementations a set of function calls (to initiate a number of tasks to be performed by the graphics modeling process) may be serialized using an API definition file. In this manner, the number of function calls required to be communicated is reduced.

Figure 4:
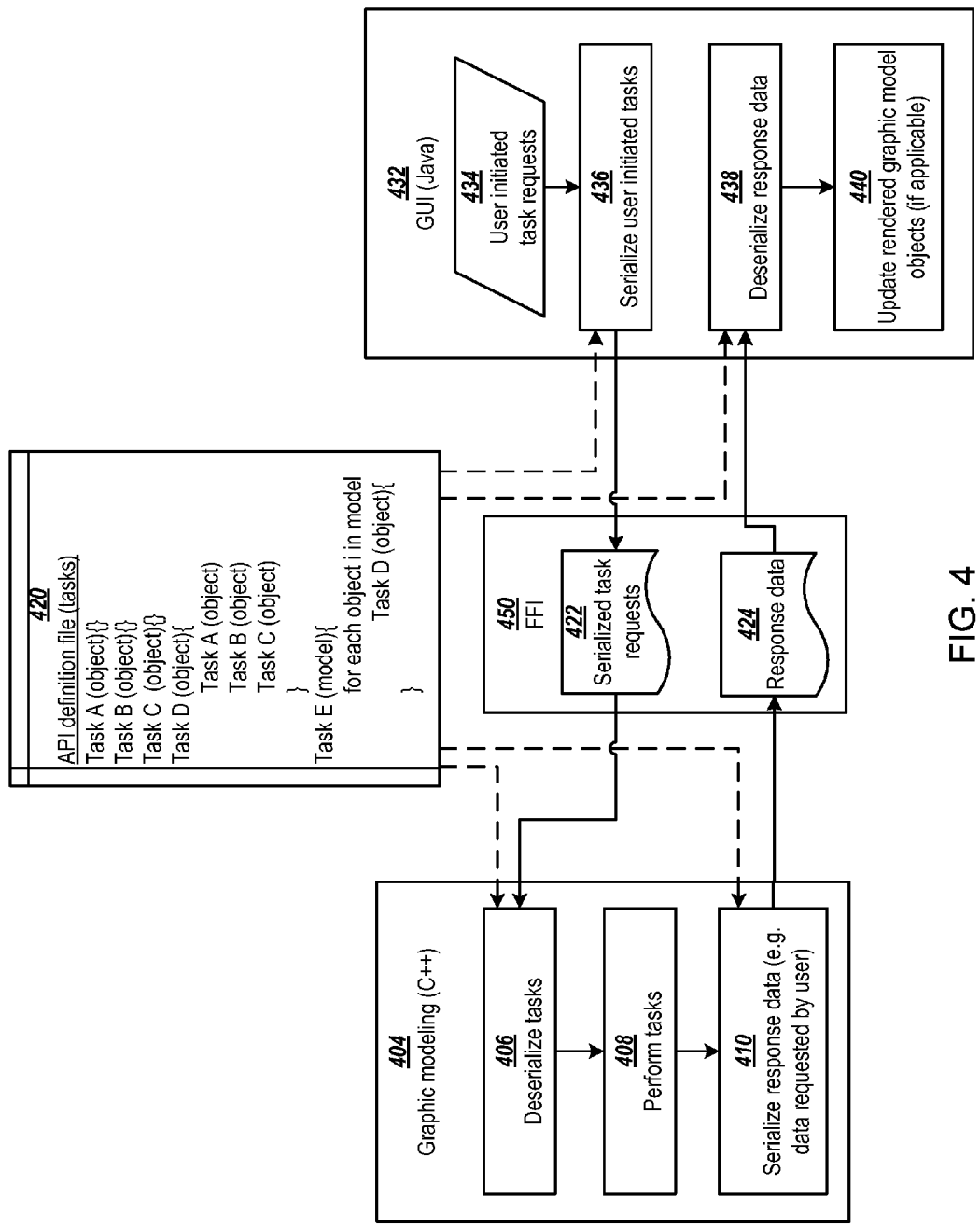
FIG. 4 shows a flowchart for performing function calls between GUI and a graphical backend database.

FIG. 4 shows a flowchart for performing function calls between a GUI process and a graphics modeling process. The GUI process 432 provides an interface through which a user may initiate a set of tasks 434 (e.g., add/remove/modify circuit elements, modify layout, modify display, perform simulation, display debugging signals). For ease of reference, tasks may be referred to as functions or processes and such terms are used interchangeably herein. The user initiated tasks 434 are serialized at block 436 according to API definition file 420.

In this example, the API definition file 420 includes objects defining three elemental function calls (tasks A, B, and C) and two macro function calls (tasks D and E). For example, if the set of user initiated tasks 434 includes a function call for task A, the function call may be serialized by replacing the function call with a corresponding object from the API definition file 420. As another example, if the set of user initiated tasks 434 includes function calls for tasks A, B, and C, the function calls may be serialized by replacing the function calls with a single object in the API definition file 420 corresponding to task D macro.

As yet another example, macro function call task E represents a request to execute task D for each object i in a circuit design model. If the set of user initiated tasks 434 includes function calls (tasks A, B, and C) to be performed for multiple objects in the circuit design model, all of these functions call may replaced with the single object in the API definition file 420 corresponding to the task E macro.

Serialized task requests 422 are communicated from the GUI process 432 to the graphics modeling process 404. The graphics modeling process 404 is configured to deserialize the serialized tasks 422 at block 406. The graphics modeling process 404 performs the tasks indicated by the deserialized tasks at block 408. If the tasks generate any data responses (e.g., data requested by a user), the data responses are serialized at block 410. For example, a user generated task may request that debugging information for a particular set of signals be displayed. In such case, graphical data representing the set of signals would be returned. Serialized response data 424 is communicated to the GUI 432. In response to receiving serialized response data 424, the GUI deserializes the response data at block 438. If applicable, the GUI uses the deserialized data to update the rendered graphics model at block 440.

Serialized data may be communicated differently in different implementations. For instance, in some implementations, serialized data (e.g., 122, 422, or 424) is communicated directly between graphics modeling and GUI processes 404 and 432 in the serialized format. However, the embodiments are not so limited. For instance, in some implementations, serialized data (e.g., 122, 422, or 424) may be formatted according to a compression and/or encryption protocol. In some implementations, serialized data is communicated by a foreign function interface (FFI). For instance, in the example shown in FIG. 4, data is communicated between a graphics modeling process 404 and a GUI process 432 using a FFI code 150 generated by the Simplified Wrapper and Interface Generator (SWIG). SWIG is a tool for generation of a FFI for communication between C/C++ functions and other languages (e.g., Java, Python, Perl, or Tcl).

Figure 5:
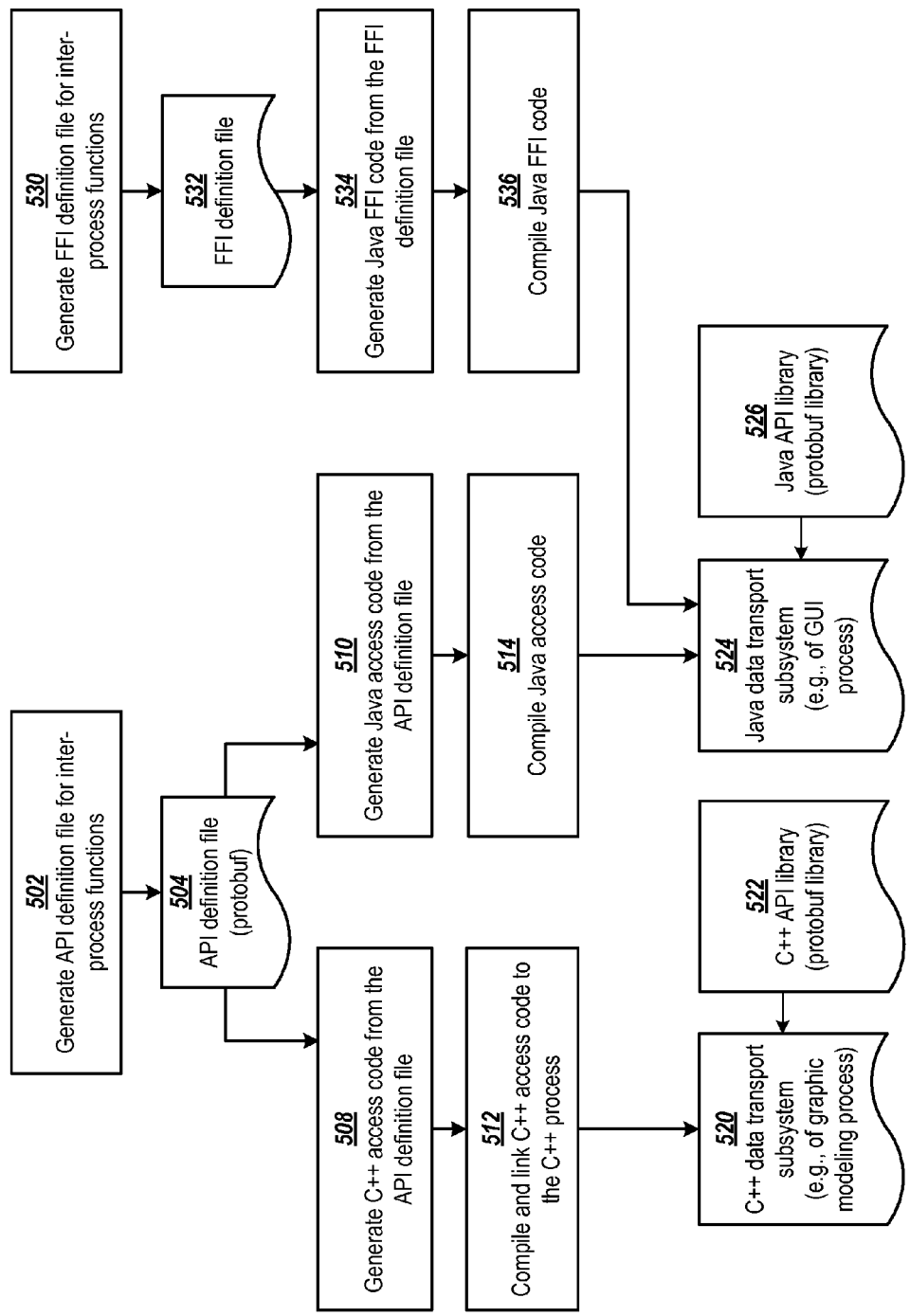
FIG. 5 shows a method for generating sub-system code for data transport between a C++ data transport sub-system and a Java data transport sub-system.

FIG. 5 shows a method for generating sub-system code for data transport between a C++ data transport sub-system (e.g., the C++ modeling process 404) and a Java data transport sub-system (e.g., the Java GUI process 432). At block 502, an API definition file 504 is generated for inter-process functions of the C++ and Java data transport sub-systems. Inter-process functions of the C++ sub-system are those that are called by the Java sub-system. Similarly, inter-process functions of the Java sub-system are those that are called by the C++ sub-system. To generate the API definition file, code of the C++ and Java sub-systems is traversed to determine a set of inter-process functions. After determining the set of inter-process functions, objects are created in the API definition file 504 to represent function calls to the inter-process functions.

Java access code for the inter-process functions is generated from the API definition file 504 at block 510. The Java access code is compiled at block 514. The compiled Java access code is added to the Java subsystem 524 and allows the sub-system to communicate data using functions in a Java API library 526 and objects defined in the API definition file 504. As an example, for an implementation using the protocol buffers API, Java access code may be generated with the protoc compiler using the command "Protoc-java_out=.<API definition file>."

C++ access code for the inter-process functions is generated from the API definition file 504 at block 508. The C++ access code is compiled at block 512. The compiled C++ access code is added to the C++ subsystem 520 and allows the sub-system to communicate data using functions in a C++ API library 522 and objects defined in the API definition file 504. As an example, for an implementation using the protocol buffers API, C++ access code may be generated with the protoc compiler using the command "Protoc-cpp_out=.<API definition file>."

An FFI definition file 532 for inter-process functions is generated at block 530. Wrapper code is generated from the FFI definition file to communicate data (e.g. serialized data) between the C++ and Java processes. For instance, as indicated above, SWIG may be used to generate an FFI to communicate serialized data. SWIG generates wrapper code for a non-C++ process to communicate data with C++ processes. Java FFI code is generated from the FFI definition file at block 534. The Java code is compiled at block 536 and linked with the Java subsystem 524 to facilitate communication between the C++ and Java sub-systems.

Figure 6:
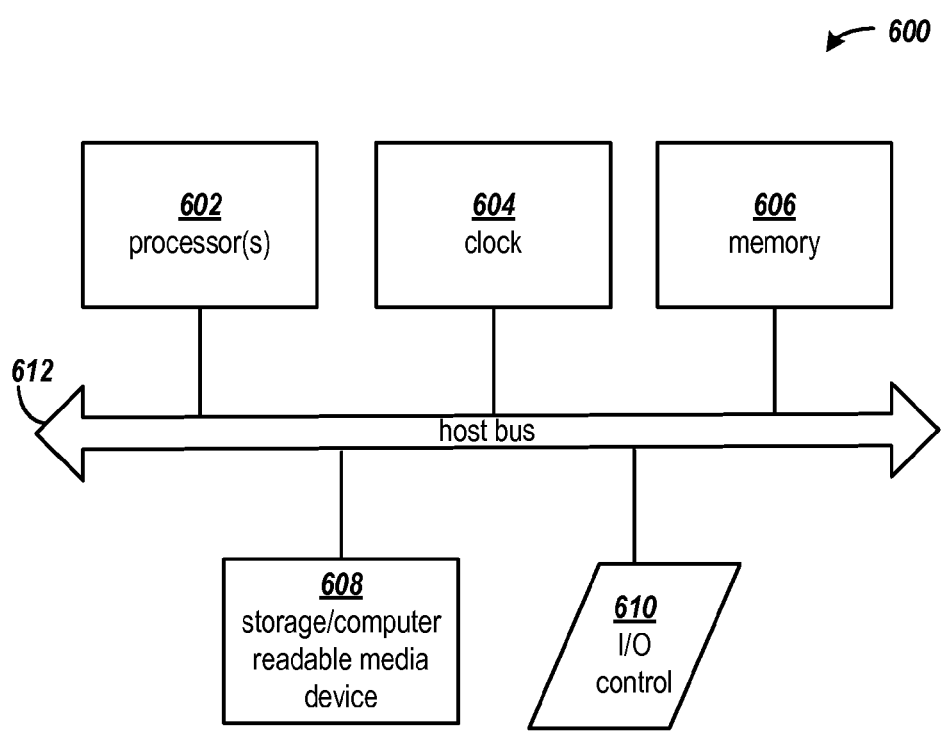
FIG. 6 shows a computing arrangement that may be configured to perform the processes disclosed herein.

FIG. 6 shows a block diagram of an example computing arrangement that may be configured to perform the processes described herein. It will be appreciated that various alternative computing arrangements, including one or more processors and a memory arrangement configured with program code, would be suitable for hosting the disclosed processes and data structures. The computer code, which implements the disclosed processes, is encoded in a processor executable format and may be stored and provided via a variety of computer-readable storage media or delivery channels such as magnetic or optical disks or tapes, electronic storage devices, or as application services over a network.

Processor computing arrangement 600 includes one or more processors 602, a clock signal generator 604, a memory arrangement 606, a storage arrangement 608, and an input/output control unit 610, all coupled to a host bus 612. The arrangement 600 may be implemented with separate components on a circuit board or may be implemented internally within an integrated circuit. When implemented internally within an integrated circuit, the processor computing arrangement is otherwise known as a microcontroller.

The architecture of the computing arrangement depends on implementation requirements as would be recognized by those skilled in the art. The processor(s) 602 may be one or more general-purpose processors, or a combination of one or more general purpose processors and suitable co-processors, or one or more specialized processors (e.g., RISC, CISC, pipelined, etc.).

The memory arrangement 606 typically includes multiple levels of cache memory, and a main memory. The storage arrangement 608 may include local and/or remote persistent storage, such as provided by magnetic disks (not shown), flash, EPROM, or other non-volatile data storage. The storage unit may be read or read/write capable. Further, the memory arrangement 606 and storage arrangement 608 may be combined in a single arrangement.

The processor(s) 602 executes the software in storage arrangement 608 and/or memory arrangement 606, reads data from and stores data to the storage arrangement 608 and/or memory arrangement 606, and communicates with external devices through the input/output control arrangement 610. These functions are synchronized by the clock signal generator 604. The resource of the computing arrangement may be managed by either an operating system (not shown), or a hardware control unit (not shown).

The examples described herein are thought to be applicable to a variety of CAD systems (e.g., circuit design, mechanical design, and architecture). Other aspects and embodiments will be apparent to those skilled in the art from consideration of the specification. For instance, although examples may in some cases be described in individual figures, it will be appreciated that features from one figure can be combined with features of another figure even though the combination is not explicitly shown or explicitly described as a combination. The examples may be implemented as one or more processors configured to execute software, as an application specific integrated circuit (ASIC), or as a logic on a programmable logic device, for example. It is intended that the specification and the illustrated structures and methods be considered as examples only, with a true scope of the invention being indicated by the following claims.

What is claimed is:

1. A system for graphics generation, comprising:
a processor configured to implement processes including:
a modeling process configured to:
generate a first graphics model including a plurality of objects, each object defining a respective graphical depiction for a respective element of a programmable IC;
serialize objects of the first graphics model to produce a serialized graphics model by replacing instances of the objects in the first graphics model with respective markers referencing the object in a first application programming interface (API) definition file; and
provide the serialized graphics model to a graphical user interface (GUI) process by communicating an amount of data that is less than an amount of data required to be communicated in order to provide the first graphics model to the second process; and
the GUI process, the GUI process being configured to:
in response to receiving one or more objects of the serialized graphics model, deserialize the one or more objects of the serialized graphics model according to the first API definition file to produce a second graphics model; and
render the one or more objects of the second graphics model.

2. The system of claim 1, wherein:
at least one object in the serialized graphics model is defined as a macro that indicates a combination of two or more objects of a plurality of other objects of the serialized graphics model; and
the GUI process is configured to, in response to receiving the at least one object defined as a macro, deserialize and render the two or more objects of the serialized graphics model.

3. The system of claim 1, wherein the graphics model defines a graphical depiction of each logical component of the programmable IC and a graphical depiction for each routing resource of the programmable IC.

4. The system of claim 3, wherein the GUI process is configured to:
in response to a first input command, deserialize and render the logical components without rendering the routing resources; and
in response to a second input command, deserialize and render the logical components and the routing resources.

5. The system of claim 4, wherein the GUI process is further configured to:
in response to the second input command, deserialize and render the logical components and ones of the routing resources that are routed; and
in response to a third input command, deserialize and render the logical components, ones of the routing resources that are routed, and ones of the routing resources that are unrouted.

6. The system of claim 1, wherein:
the modeling process is compiled from a first high-level programming language; and
the GUI process is compiled from a second high-level programming language.

7. The system of claim 1, wherein the first API definition file defines one or more protocol buffers.

8. The system of claim 1, wherein the modeling process and GUI process are further configured to implement functions of a foreign function interface (FFI) that provides the serialized graphics model from the modeling process to the GUI process.

9. The system of claim 8, wherein the modeling process is further configured to execute the one or more of the functions of the FFI to provide the serialized graphics model to the GUI process in response to a serialized input command received from the GUI process via the FFI.

10. The system of claim 1, wherein the GUI process is further configured, in response to an input set of process requests, to perform operations including:
serializing the set of process requests according to a second API definition file to produce a serialized set of process requests; and
communicating the serialized set of process requests to the modeling process via the FFI functions.

11. The system of claim 10, wherein the modeling process is further configured to deserialize the serialized set of process requests according to the second API definition file.

12. A method for graphics generation, comprising:
using a first process on a programmed processor:
generating a first graphics model including a plurality of objects, each object defining a respective graphical depiction for a respective element of a programmable IC; and
serializing objects of the first graphics model to produce a serialized graphics model by replacing instances of the objects in the first graphics model with respective markers referencing the object in a first application programming interface (API) definition file;
providing the serialized graphics model to a second process by communicating an amount of data that is less than an amount of data required to be communicated in order to provide the first graphics model to the second process; and
using the second process on the programmed processor:
deserializing the one or more objects of the serialized graphics model according to the first API definition file to produce a second graphics model; and
rendering the one or more objects of the second graphics model.

13. The method of claim 12, wherein:
at least one object in the serialized graphics model is defined as a macro that indicates a combination of two or more objects of a plurality of other objects of the serialized graphics model; and
the deserializing and rendering includes, in response to receiving the at least one object defined as a macro, deserializing and rendering the two or more objects of the serialized graphics model.

14. The method of claim 12, wherein the deserializing and rendering includes:
in response to a first input command, deserializing and rendering the logical components of the programmable IC without rendering the routing resources of the programmable IC; and
in response to a second input command, deserializing and rendering the logical components and ones of the routing resources that are routed.

15. The method of claim 14, wherein the deserializing and rendering further includes:
in response to a third input command, deserializing and rendering the logical components, ones of the routing resources that are routed, and ones of the routing resources that are unrouted.

16. The method of claim 12, further comprising:
compiling a first code segment written in a first high-level programming language to produce executable code that, when executed by the programmed processor, causes the programmed processor to perform the first process; and
compiling a second code segment written in a second high-level programming language to produce executable code that, when executed by the programmed processor, causes the programmed processor to perform the second process.

17. The method of claim 12, wherein the API definition file defines one or more protocol buffers.

18. The method of claim 12, wherein the providing of the serialized graphics to the second process includes using a foreign function interface (FFI) to provide the serialized graphics model from the first process to the second process.

19. The method of claim 12, wherein:
the first process comprises a graphics modeling process; and
the second process comprises a graphical user interface.

20. A method for graphics generation, comprising:
using a first process on a programmed processor:
generating a first graphics model including a plurality of objects, each object defining a graphical depiction for a respective element of a programmable IC; and
serializing objects of the first graphics model to produce a serialized graphics model by replacing instances of the objects in the first graphics model with respective markers referencing the object in an application programming interface (API) definition file;
providing the serialized graphics model to a second process by communicating an amount of data that is less than an amount of data required to be communicated in order to provide the first graphics model to the second process; and
using the second process on the programmed processor:
deserializing the one or more objects of the serialized graphics model according to the API definition file to produce a second graphics model;
in response to a first input command, using the second graphics model to render a first subset of the elements corresponding to logic components of the programmable IC without rendering a second subset of the elements corresponding to routing resources of the programmable IC; and
in response to a second input command, using the second graphics model to render the first and second subsets of the elements.

* * * * *